United States Patent
Kim et al.

(10) Patent No.: US 12,309,916 B2
(45) Date of Patent: *May 20, 2025

(54) METHOD OF VERIFYING FAULT OF INSPECTION UNIT, INSPECTION APPARATUS AND INSPECTION SYSTEM

(71) Applicant: KOH YOUNG TECHNOLOGY INC., Seoul (KR)

(72) Inventors: Kwan Seong Kim, Suwon-si (KR); Myung Ho Kim, Cheonan-si (KR); Nam Kyu Park, Namyangju-si (KR); Joo Hyuk Kim, Seoul (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 259 days.

This patent is subject to a terminal disclaimer.

(21) Appl. No.: 17/853,440

(22) Filed: Jun. 29, 2022

(65) Prior Publication Data
US 2022/0330420 A1 Oct. 13, 2022

Related U.S. Application Data

(63) Continuation-in-part of application No. 16/074,493, filed as application No. PCT/KR2017/001253 on Feb. 6, 2017, now Pat. No. 11,410,297.

(30) Foreign Application Priority Data

Feb. 4, 2016 (KR) ........................ 10-2016-0014364

(51) Int. Cl.
*H05K 1/02* (2006.01)
*G06T 1/00* (2006.01)
*G06T 7/00* (2017.01)

(52) U.S. Cl.
CPC ......... *H05K 1/0269* (2013.01); *G06T 1/0014* (2013.01); *G06T 7/0002* (2013.01)

(58) Field of Classification Search
CPC .... H04K 1/0269; G06T 1/0014; G06T 7/0002
See application file for complete search history.

(56) References Cited

U.S. PATENT DOCUMENTS

| 5,825,483 A | 10/1998 | Michael |
| 6,681,151 B1 | 1/2004 | Weinzimmer |

(Continued)

FOREIGN PATENT DOCUMENTS

| CN | 103149556 | 6/2013 |
| CN | 104048674 | 9/2014 |

(Continued)

OTHER PUBLICATIONS

International Search Report for International Application No. PCT/KR2017/001253, dated May 11, 2017.

(Continued)

*Primary Examiner* — David Perlman
(74) *Attorney, Agent, or Firm* — KILE PARK REED & HOUTTEMAN PLLC

(57) ABSTRACT

A method of verifying a fault of an inspection unit, an inspection apparatus, and an inspection system are disclosed. The method according to the present disclosure includes: providing a verification reference body which is formed on a frame attached to an inspection system; placing the inspection unit on the verification reference body; obtaining image data of the verification reference body through the inspection unit; verifying a fault of the inspection unit by extracting a movement error and height error of the inspection unit from the image data; and generating a verification result indicating the fault of the inspection unit.

14 Claims, 12 Drawing Sheets

(56) References Cited

U.S. PATENT DOCUMENTS

| | | |
|---|---|---|
| 9,062,966 B2 | 6/2015 | Jeong |
| 2005/0033528 A1 | 2/2005 | Toth |
| 2005/0225665 A1 | 10/2005 | Chen |
| 2007/0158636 A1 | 7/2007 | Tezuka |
| 2008/0117411 A1 | 5/2008 | Vuong et al. |
| 2010/0171947 A1 | 7/2010 | Yoshino |
| 2010/0322506 A1 | 12/2010 | Muramatsu et al. |
| 2011/0254949 A1 | 10/2011 | You |
| 2011/0286001 A1 | 11/2011 | Taniguchi et al. |
| 2014/0267681 A1 | 9/2014 | Liu et al. |
| 2016/0209207 A1 | 7/2016 | Kim et al. |
| 2017/0303466 A1 | 10/2017 | Grufman |
| 2019/0096083 A1* | 3/2019 | Arano ............... G06T 7/70 |

FOREIGN PATENT DOCUMENTS

| | | |
|---|---|---|
| CN | 104834656 | 8/2015 |
| JP | 11-230863 | 8/1999 |
| JP | 2005-121979 | 5/2005 |
| JP | 2008-170279 | 7/2008 |
| JP | 2009-36589 | 2/2009 |
| JP | 2011-007526 | 1/2011 |
| KR | 10-2007-0014585 | 2/2007 |
| KR | 10-2011-0063966 | 6/2011 |
| KR | 10-2011-0115082 | 10/2011 |
| KR | 10-2011-0115083 | 10/2011 |
| KR | 10-2012-0000610 | 1/2012 |
| KR | 10-2015-0023205 | 3/2015 |

OTHER PUBLICATIONS

Korean Office Action for Application No. 10-2016-0014364 with English Translation, dated Mar. 27, 2017.
Extended European Search report corresponding European Patent Application No. 17747815.3, dated Aug. 26, 2019.
Chinese Office Action for Chinese Application No. 201780008728.0, with English translation, dated Sep. 11, 2019.
Written Opinion with English translation corresponding to International Application No. PCT/KR2017/001253, dated May 11, 2017.
Chinese Office Action, with English translation, corresponding to Chinese Application No. or Publication No. 201780008728.0, dated Jun. 23, 2020.
Shen Zhiwei, A Practical Handbook of Print Digitization, 1st Edition, May 31, 2013, Printing Industry Press, Articles 18-24.
Chinese Office Action with English translation for Chinese Patent Application or Patent No. 202110725373.5, dated Jan. 9, 2025.
Chinese Office Action with English translation for Chinese Patent Application No. 202110725373.5 dated Apr. 10, 2025.

* cited by examiner

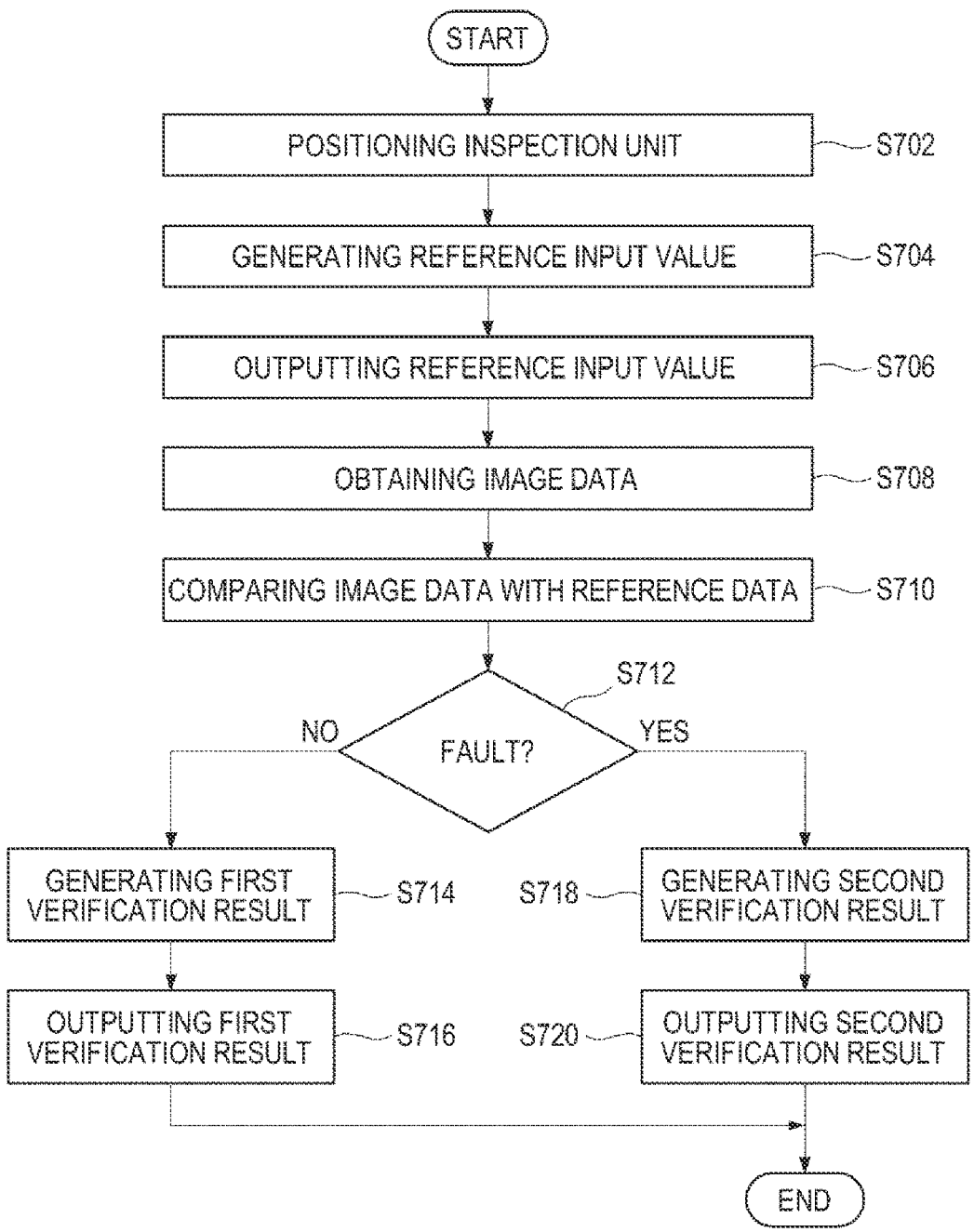

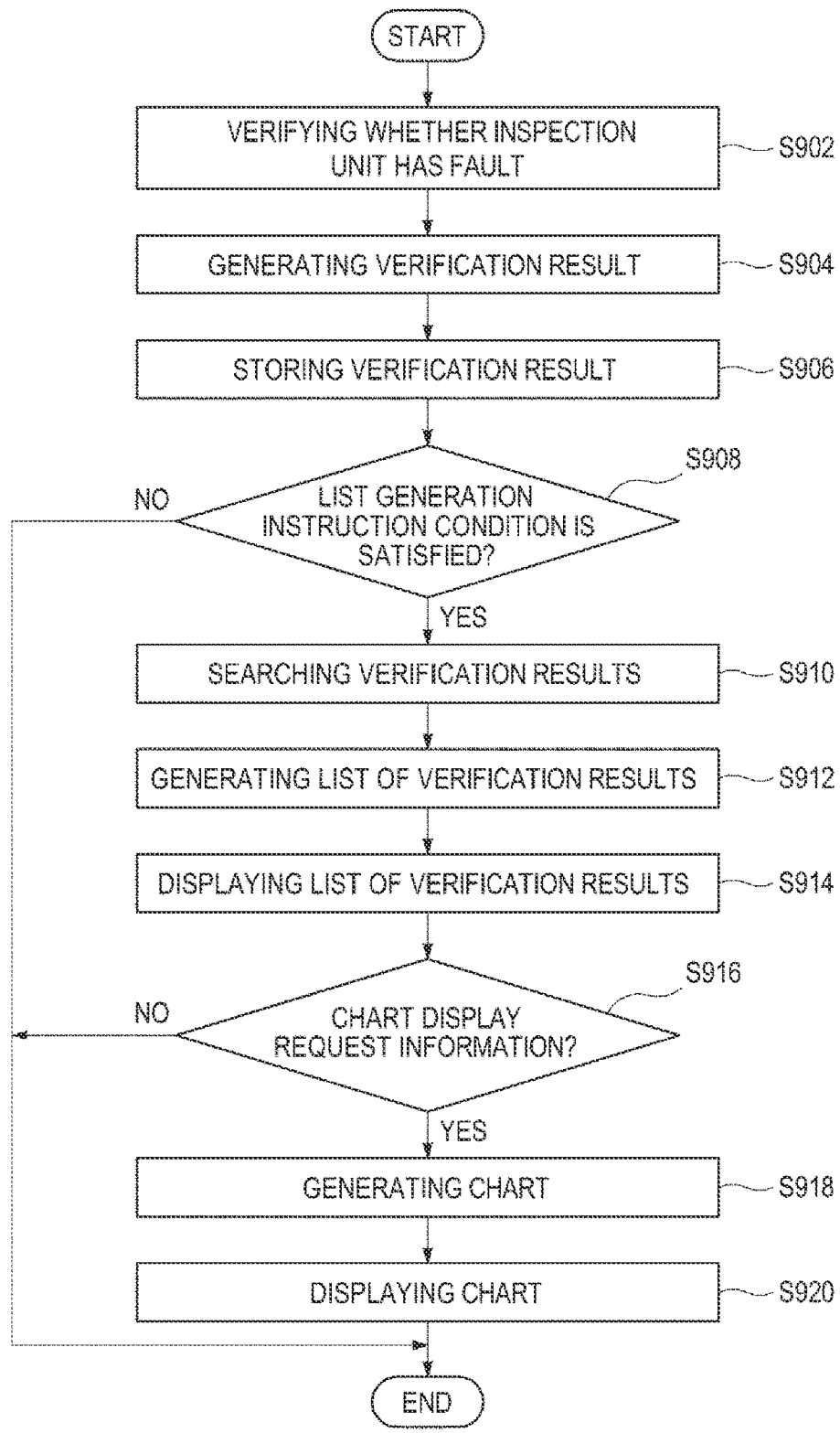

FIG. 10

| Verification Result | | | |
|---|---|---|---|
| Index | Date | Time | Result |
| 1 | 0000-00-00 | 00:00:00 | Warning |
| 2 | 0000-00-00 | 00:00:00 | Bad |
| 3 | 0000-00-00 | 00:00:00 | Bad |
| 4 | 0000-00-00 | 00:00:00 | Bad |
| 5 | 0000-00-00 | 00:00:00 | Bad |
| 6 | 0000-00-00 | 00:00:00 | Bad |
| 7 | 0000-00-00 | 00:00:00 | Bad |
| 8 | 0000-00-00 | 00:00:00 | Bad |
| 9 | 0000-00-00 | 00:00:00 | Bad |
| 10 | 0000-00-00 | 00:00:00 | Bad |
| 11 | 0000-00-00 | 00:00:00 | Bad |
| 12 | 0000-00-00 | 00:00:00 | Bad |
| 13 | 0000-00-00 | 00:00:00 | Bad |
| 14 | 0000-00-00 | 00:00:00 | Bad |
| 15 | 0000-00-00 | 00:00:00 | Warning |
| 16 | 0000-00-00 | 00:00:00 | Bad |
| 17 | 0000-00-00 | 00:00:00 | Bad |
| 18 | 0000-00-00 | 00:00:00 | Bad |
| 19 | 0000-00-00 | 00:00:00 | Bad |
| 20 | 0000-00-00 | 00:00:00 | Warning |
| 21 | 0000-00-00 | 00:00:00 | Warning |
| 22 | 0000-00-00 | 00:00:00 | Warning |
| 23 | 0000-00-00 | 00:00:00 | Warning |
| 24 | 0000-00-00 | 00:00:00 | Warning |
| 25 | 0000-00-00 | 00:00:00 | Good |
| 26 | 0000-00-00 | 00:00:00 | Warning |
| 27 | 0000-00-00 | 00:00:00 | Warning |
| 28 | 0000-00-00 | 00:00:00 | Warning |
| 29 | 0000-00-00 | 00:00:00 | Warning |
| 30 | 0000-00-00 | 00:00:00 | Warning |
| 31 | 0000-00-00 | 00:00:00 | Warning |
| 32 | 0000-00-00 | 00:00:00 | Warning |
| 33 | 0000-00-00 | 00:00:00 | Warning |
| 34 | 0000-00-00 | 00:00:00 | Warning |
| 35 | 0000-00-00 | 00:00:00 | Warning |
| 36 | 0000-00-00 | 00:00:00 | Warning |

Bright Result | PZT Result | Height Result

Please Select Items and Click [View] Button

Latest  10   Select and View   View
        1020      1030          1040

1010

Close

METHOD OF VERIFYING FAULT OF INSPECTION UNIT, INSPECTION APPARATUS AND INSPECTION SYSTEM

CROSS-REFERENCE TO RELATED APPLICATIONS

This application is a continuation application of U.S. patent application Ser. No. 16/074,493, filed Aug. 1, 2018 (now pending), the disclosure of which is herein incorporated by reference in its entirety. The U.S. patent application Ser. No. 16/074,493 is a national entry of International Application No. PCT/KR2017/001253, filed on Feb. 6, 2017, which claims priority to Korean Application No. 10-2016-0014364 filed on Feb. 4, 2016, respectively, the entire contents of which are incorporated herein by reference.

TECHNICAL FIELD

The present disclosure relates to a method of verifying a fault of an inspection unit, an inspection apparatus and an inspection system.

BACKGROUND ART

In general, at least one Printed Circuit Board (PCB) is provided in an electronic device and various circuit elements such as circuit patterns, connection pads, and driving chips electrically connected with the connection pads are mounted on the PCB.

A substrate formed by mounting electronic elements on a PCB is used in various electronic products. The substrate is manufactured by applying lead to pad areas of a bare substrate and coupling terminals of the electronic elements to the lead-applied areas.

A substrate inspection system performs a solder paste inspection (SPI) that inspects whether lead is properly applied to the pad areas of the PCB before the electronic elements are mounted on the PCB, and an automated optical inspection (AOI) that detects various types of defects relating to whether the electronic elements are properly soldered to the PCB after the electronic elements are mounted on the PCB.

In the related art, a user has checked an inspection result of an inspection object, and when the inspection result was bad, the user has stopped the substrate inspection system, mounted a calibration target on a work stage, and performed a calibration of the substrate inspection system. Accordingly, it is impossible to know whether the inspection performance has deteriorated, until a user checks the inspection result, so that there is the problem that PCBs that have not been properly inspected are manufactured as products.

SUMMARY

The present disclosure provides a method of verifying whether an inspection unit, capable of inspecting a defect of an inspected body, in an inspection apparatus has a fault, and an inspection system.

According to one embodiment of the present disclosure, there is provided a method of verifying whether an inspection unit, capable of inspecting a defect of an inspected body, in an inspection system has a fault, the method including: providing a verification reference body formed on a frame attached to the inspection system; positioning the inspection unit over the verification reference body; obtaining image data of the verification reference body through the inspection unit; verifying whether the inspection unit has a fault by extracting a movement error and a height error of the inspection unit from the image data; and generating a verification result indicating whether the inspection unit has a fault.

In an embodiment, the verification reference body includes a flat plate having a flat area capable of indicating a height reference and a gray level, at least two fiducial markers disposed around the flat area, and a height marker disposed around the flat area, and verifying whether the inspection unit has a fault includes: extracting a movement error of the inspection unit from image data of the at least two fiducial makers; and extracting a height error of the inspection unit from image data of the flat plate or the height marker.

In an embodiment, the verification reference body includes at least two fiducial markers, a flat plate indicating a height reference and having a flat area defined by the at least two fiducial markers, and a height marker disposed around the flat area, and verifying whether the inspection unit has a fault includes: extracting a movement error of the inspection unit from image data of the at least two fiducial markers; and extracting a height error of the inspection unit from image data of the flat plate or the height marker.

In an embodiment, the flat plate indicates a height reference for verifying an accuracy of the height of the inspection unit.

In an embodiment, the at least two fiducial markers indicate at least two positions for verifying an accuracy of movement of the inspection unit.

In an embodiment, the height marker indicates a predetermined height for verifying an accuracy of height measurement of the inspection unit.

In an embodiment, extracting a movement error of the inspection unit includes: detecting the position of the at least two fiducial markers from the image data of the at least two fiducial markers; and verifying whether the inspection unit has a fault by comparing the detected position with a predetermined reference position of the at least two fiducial markers.

In an embodiment, extracting a height error of the inspection unit includes: detecting the height of the height marker using the image data of the flat plate or the height marker; and verifying whether the inspection unit has a fault by comparing the detected height with a predetermined height of the height marker.

In an embodiment, positioning the inspection unit over the verification reference body includes positioning the inspection unit over the verification reference body based on an inspection defect rate of the inspection unit.

In an embodiment, the method further includes correcting a fault of the inspection unit by calibrating the inspection unit based on the verification result.

According to another embodiment of the present disclosure, there is provided an inspection apparatus for verifying whether an inspection unit, capable of inspecting a defect of an inspected body, in an inspection system has a fault, the inspection apparatus including: a frame attachable to the inspection system; and a verification reference body formed on the frame, and the verification reference body includes a flat plate having a flat area capable of indicating a height reference and a gray level, at least two fiducial markers disposed around the flat area, and a height marker disposed around the flat area.

According to yet another embodiment of the present disclosure, there is provided an inspection apparatus for verifying whether an inspection unit, capable of inspecting a defect of an inspected body, in an inspection system has a fault, the inspection apparatus including: a frame attachable to the inspection system; and a verification reference body formed on the frame, and the verification reference body includes at least two fiducial markers, a flat plate indicating a height reference and having a flat area defined by the at least two fiducial markers, and a height marker disposed around the flat area.

In an embodiment, the flat plate indicates a height reference for verifying an accuracy of the height of the inspection unit.

In an embodiment, the at least two fiducial markers indicate at least two positions for verifying an accuracy of movement of the inspection unit.

In an embodiment, the height marker indicates a predetermined height for verifying an accuracy of height measurement of the inspection unit.

In an embodiment, the verification reference body is disposed in a concave portion of the frame.

In an embodiment, the inspection apparatus further includes: a cover configured to be capable of opening and closing the verification reference body disposed in the concave portion; and a driving unit moving the cover with respect to the verification reference body to open and close the verification reference body.

In an embodiment, the driving unit includes a rotating unit configured to rotate the cover to open and close the verification reference body.

In an embodiment, the driving unit includes a sliding unit configured to slide the cover to open and close the verification reference body.

In an embodiment, the inspection apparatus further includes a reflector disposed on the frame to verify whether a light source, configured to generate light, in the inspection unit has a fault.

In an embodiment, the reflector has a convex curve shape.

In an embodiment, the reflector has a concave curve shape.

According to yet another embodiment of the present disclosure, there is provided an inspection system including: an inspection unit capable of inspecting a defect of an inspected body; the inspection apparatus according to another embodiment; and a controller configured to position the inspection unit over the verification reference body, obtain image data of the verification reference body through the inspection unit, verify whether the inspection unit has a fault, and generate a verification result indicating whether the inspection unit has a fault.

In an embodiment, the controller is configured to position the inspection unit over the verification reference body based on an inspection defect rate of the inspected body by the inspection unit.

In an embodiment, the controller is configured to correct a fault of the inspection unit by calibrating the inspection unit based on the verification result.

According to the present disclosure, it is possible to automatically check whether the inspection performance of an inspection system has deteriorated without depending only on the user's empirical knowledge, so it is possible to improve a yield rate by reducing inspected bodies from being manufactured into products without properly undergoing inspection.

Further, according to the present disclosure, it is possible to automatically verify whether an inspection unit has a fault and perform a calibration of the inspection unit, depending on a fault of the inspection unit, so it is possible to efficiently manage the operation time of the inspection system.

BRIEF DESCRIPTION OF THE DRAWINGS

FIG. 7 is a flowchart showing a process of verifying whether an inspection unit has a fault through the reflector according to an embodiment of the present disclosure.

FIG. 9 is a flowchart showing a process of providing a verification result according to an embodiment of the present disclosure.

FIG. 10 is an exemplary view showing a list of verification results according to an embodiment of the present disclosure.

DETAILED DESCRIPTION

Hereinafter, exemplary embodiments of the present disclosure will be described with reference to the accompanying drawings. However, in the following description, a detailed description of widely known functions or elements will be omitted, in case there is concern of unnecessarily making the gist of the present disclosure unclear.

Figure 1:
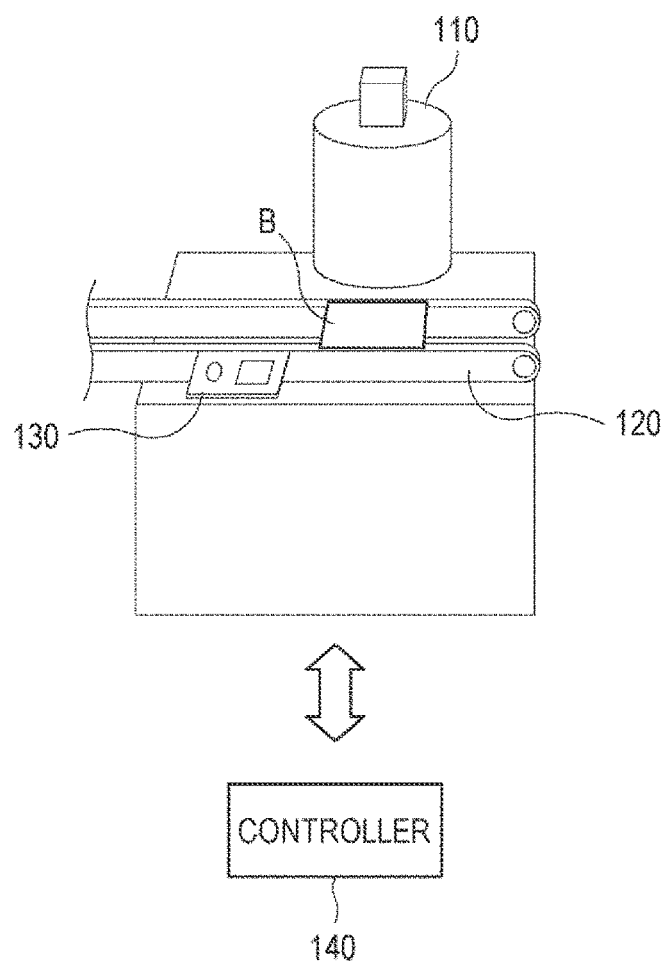
FIG. 1 is a diagram schematically showing a configuration of an inspection system according to an embodiment of the present disclosure.

FIG. 1 is a perspective view schematically showing an inspection system according to an embodiment of the present disclosure. Referring to FIG. 1, an inspection system 100 includes an inspection unit 110. The inspection unit 110 obtains image data of an inspected body by radiating light towards the inspected body and receiving light reflected from the inspected body, and inspects the inspected body based on the image data. In an embodiment, the inspected body includes a printed circuit board and the light includes pattern light and color light, but they are not limited thereto.

Figure 2:
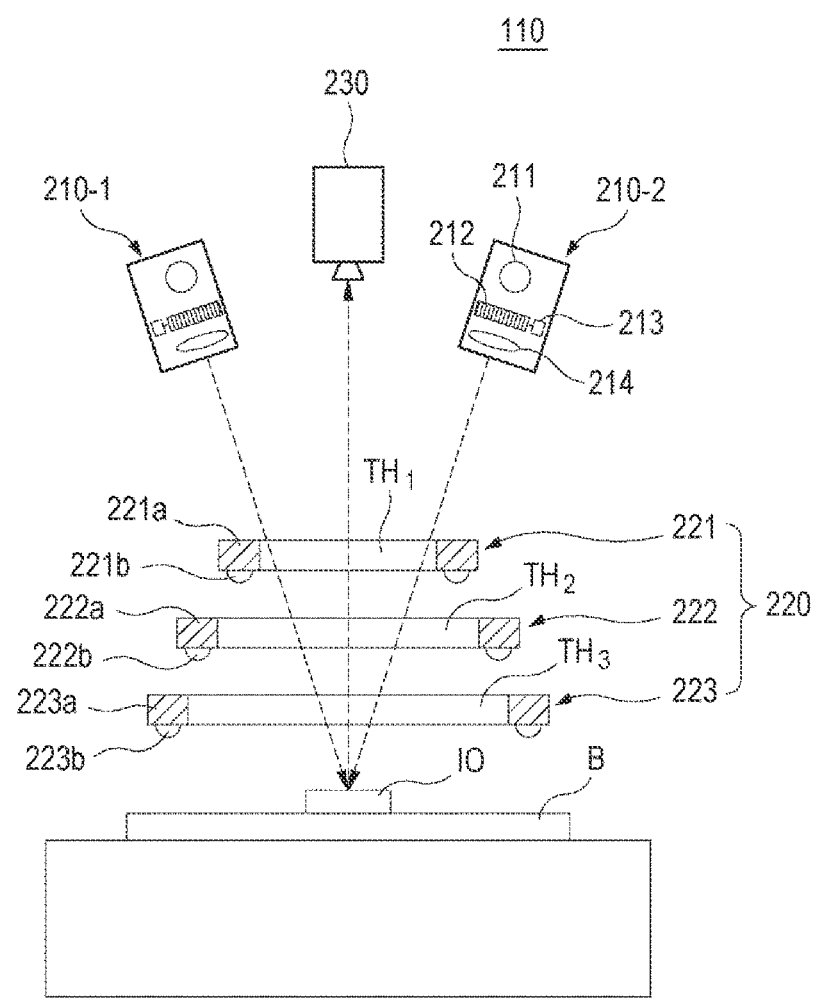
FIG. 2 is a diagram schematically showing a configuration of an inspection unit according to an embodiment of the present disclosure.

FIG. 2 is a diagram schematically showing a configuration of the inspection unit 110 according to an embodiment of the present disclosure. Referring to FIG. 2, the inspection unit 110 includes first lighting portions 210-1 and 210-2. The first lighting portions 210-1 and 210-2 radiate pattern light towards an inspected body B to measure an inspection object IO formed on the inspected body B. The inspection object IO includes a solder (not shown) formed on a pad of the inspected body B, electronic elements (not shown) or the like, however it is not limited thereto and may include all materials having a shape such as glass, plastic, and metals.

In an embodiment, the first lighting portions 210-1 and 210-2 include a light source 211 configured to generate light, a grating element 212 configured to convert the light from the light source 211 into pattern light, a grating-moving apparatus 213 configured to pitch-move the grating element 212, and a projection lens 214 configured to project the pattern light, which is converted by the grating element 212, onto the inspection object IO. The grating element 212 may be moved by a predetermined distance (e.g., $2\pi/N$ (where N is a natural number of 2 or more) through the grating-moving apparatus 213, such as a PZT (piezo) actuator, for phase transition of the pattern light. Alternatively, instead of using the grating element 212 and the grating-moving apparatus 213, it is possible to radiate the pattern light, using an image of a liquid crystal display (not shown). However, the present disclosure is not limited thereto and any other means may be used as long as it can radiate pattern light.

In an embodiment, one first lighting portion 210-1 or 210-2 may be installed or a plurality of first lighting portions may be installed to be spaced apart by a predetermined angle along a circumferential direction or a virtual polygonal plane. In another embodiment, a plurality of first lighting portions 210-1 and 2102 may be installed to be spaced apart by a predetermined interval along a direction that is perpendicular to the inspected body B. In yet another embodiment, one first lighting portion 210-1 or 210-2 may be installed along a direction that is perpendicular to the inspected body B.

The inspection unit 110 further includes a second lighting portion 220. The second lighting portion 220 radiates color light toward the inspected body B to measure the inspection object IO formed on the inspected body B. For example, the color light includes white light, red light, green light and blue light, however the color light is not limited thereto. In an embodiment, the second lighting portion 220 includes a first lamp 221, a second lamp 222, and a third lamp 223.

The first lamp 221 is installed under the first lighting portions 210-1 and 210-2. The first lamp 221 generates the color light, and radiates the color light towards the inspected body B. In an embodiment, the first lamp 221 may have a shape of a circle or a virtual polygon, however the first lamp 221 is not limited thereto. The first lamp 221 includes a first ring member 221a having an opening $TH_1$ for passing light (e.g., pattern light or color light) and at least one first light emitting element 221b, which is installed under the first ring member 221a, as a light source for generating the color light.

In an embodiment, the first lamp 221 may generate at least one color light. As one example, the first lamp 221 may generate color light having a first color (e.g., red). As another example, the first lamp 221 may generate color lights of red, green, and blue. The second lamp 222 is installed under the first lamp 221. The second lamp 222 generates color light and radiates the color light towards the inspected body B. In an embodiment, the second lamp 222 may have a shape of a circle or a virtual polygon, however the second lamp 222 is not limited thereto. The second lamp 222 includes a second ring member 222a having an opening $TH_2$ for passing light (e.g., pattern light or color light) and at least one second light emitting element 222b, which is installed under the second ring member 222a, as a light source for generating the color light. In an embodiment, the opening $TH_2$ of the second lamp 222 may be larger in diameter than the opening $TH_1$ of the first lamp 221 so that the pattern light from the first lighting portions 210-1 and 210-2 or the color light from the first lamp 221 can be radiated towards the inspected body B, or light (e.g., pattern light or color light) reflected from the inspected body B can be radiated.

In an embodiment, the second lamp 222 may generate at least one color light. As one example, the second lamp 222 may generate a color light having a color (e.g., green) that is different from that of the color light generated by the first lamp 221. As another embodiment, the second lamp 222 may generate color lights of red, green, and blue.

The third lamp 223 is installed under the second lamp 222. The third lamp 223 generates color light, and radiates the color light towards the inspected body B. In an embodiment, the third lamp 223 may have a shape of a circle or a virtual polygon, however the third lamp 223 is not limited thereto. The third lamp 223 includes a third ring member 223a having an opening $TH_3$ for passing light (e.g., pattern light or color light) and at least one third light emitting element 223b, which is installed under the third ring member 223a, as a light source for generating the color light. In an embodiment, the opening $TH_3$ of the third lamp 223 may be larger in diameter than the opening $TH_2$ of the second lamp 222 so that the pattern light from the first lighting portions 210-1 and 210-2 or the color light from the first lamp 221 or second lamp 222 can be radiated towards the inspected body B or the light (e.g., pattern light or color light) reflected from the inspected body B can be radiated.

In an embodiment, the third lamp 223 may generate at least one color light. As one example, the third lamp 223 may generate a color light having a color (e.g., green) that is different from that of the color light generated by the first lamp 221 and the second lamp 222. As another embodiment, the third lamp 223 may generate color lights of red, green, and blue.

Although the second lighting portion 220 includes the first lamp 221, the second lamp 222, and the third lamp 223 in the embodiment described above, however the second lighting portion 220 is not limited thereto. For example, the second lighting portion 220 may include at least one lamp.

The inspection unit 110 further includes an imaging portion 230. The imaging portion 230 obtains image data of the inspected body B by receiving light reflected by the inspected body B. That is, the imaging portion 230 obtains the image data of the inspected body B by photographing the inspected body B through the radiation of the pattern light from the first lighting portions 210-1 and 210-2. Further, the imaging portion 230 obtains the image data of the inspected body B by photographing the inspected body B through the radiation of the color light from the second lighting portion 220. As one example, the imaging portion 230 may be installed at an upper position perpendicular to the inspected body B. As another example, a plurality of imaging portions 230 may be installed at an upper position perpendicular to the inspected body B and may be installed along a circumferential direction to be spaced apart by a predetermined angle. The imaging portion 230 may be a charge coupled device (CCD) camera or a complementary metal oxide semiconductor (CMOS) camera, however the imaging portion 230 is not limited thereto.

The inspection unit 110 shown in FIG. 2 is an example of an inspection device that can obtain image data of the inspected body B, so it should be noted that the inspection unit 110 is not limited to the configuration shown in FIG. 2.

Referring back to FIG. 1, the inspection system 100 further includes a moving unit 120. The moving unit 120 moves the inspected body B to the inspection unit 110. The moving unit 120 may include a conveyer (not shown) or the like, but the moving unit 120 is not limited thereto.

The inspection system 100 further includes an inspection apparatus 130 for verifying whether the inspection unit 110 has a fault. In an embodiment, the inspection apparatus 130 may be attached to a side of the inspection system 100. For example, the inspection apparatus 130 is attached to a side of the moving unit 120, however the inspection apparatus 130 is not limited thereto.

Figure 3:
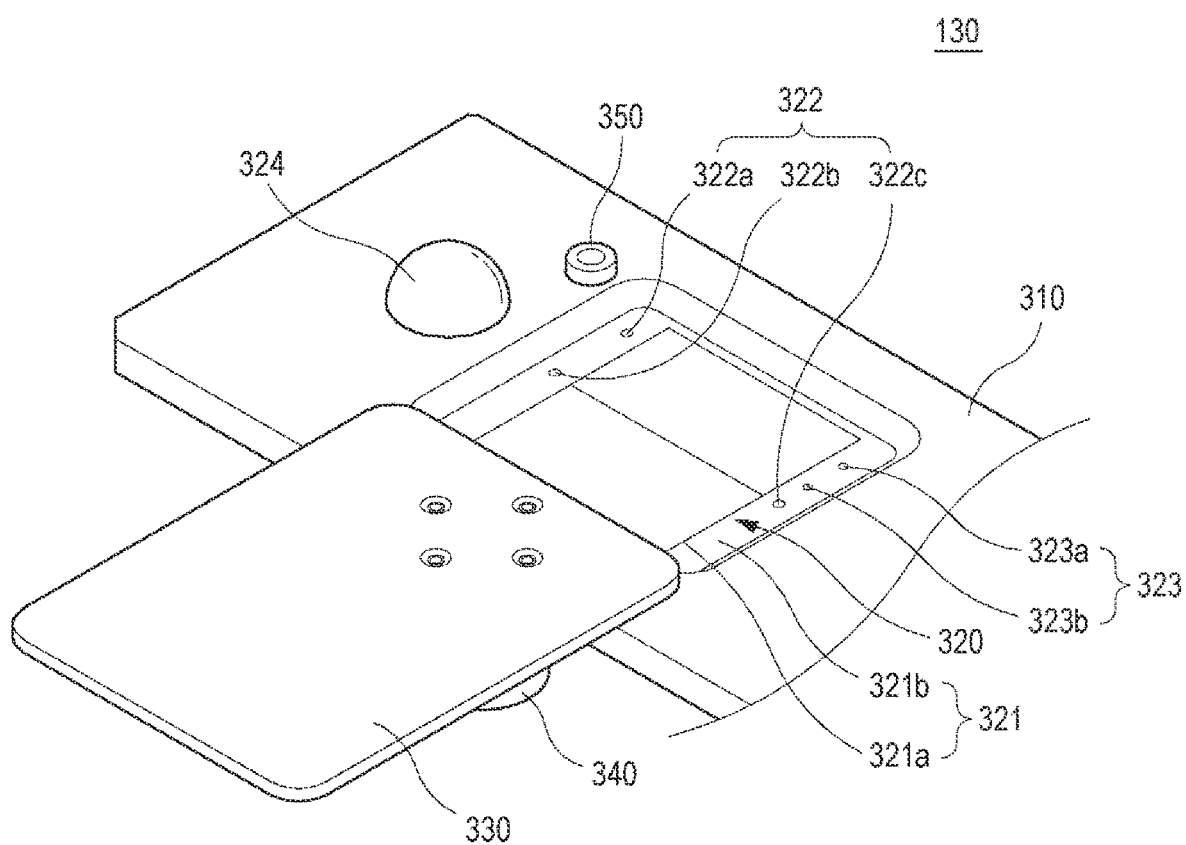
FIG. 3 is a perspective view schematically showing a configuration of an inspection apparatus according to an embodiment of the present disclosure.

FIG. 3 is a perspective view schematically showing a configuration of the inspection apparatus 130 according to an embodiment of the present disclosure. Referring to FIG. 3, the inspecting apparatus 130 includes a frame 310 that can be attached to the inspection system 100, and a verification reference body 320 formed on the frame 310. In an embodiment, the verification reference body 320 may be disposed in a concave portion of the frame 310 as shown in FIG. 3, however the verification reference body 320 is not limited thereto. For example, the verification reference body 320 may be disposed on the frame 310.

The verification reference body 320 may include a first verification target 321, a second verification target 322, and a third verification target 323.

The first verification target 321 is a verification target that indicates a height reference for verifying light radiated from the inspection unit 110 and a reference plane for measuring height of the inspection unit 110. For example, the first verification target 321 includes a flat plate 321b having a flat area 321a that can indicate the height reference. Also, the flat area 321a can indicate one or more gray level (e.g., gray) or a color including one or more gray level.

The second verification target 322 is a verification target for verifying the accuracy of movement of the inspection unit 110. That is, the second verification target 322 is a verification target for verifying whether the inspection unit 110 moves accurately to a predetermined position. The second verification target 322 may include at least two fiducial markers representing at least two positions for verifying the accuracy of movement of the inspection unit 110. As one example, the second verification target 322 includes a first fiducial marker 322a, a second fiducial marker 322b, and a third fiducial marker 322c, as shown in FIG. 3. The first to third fiducial markers 322a to 322c are markers for verifying the movement of the inspection unit 110, and in detail, the first to third fiducial markers 322a to 322c are markers for verifying X and Y offset or X, Y, and Z skew. As another example, the second verification target 322 may include two fiducial markers and the two fiducial markers may be disposed in parallel with the longitudinal direction of the frame 310 or may be disposed at different positions.

The third verification target 323 is a verification target for verifying the accuracy of height measurement of the inspection unit 110. The third verification target 323 may include at least one height target having a predetermined height for verifying the accuracy of height measurement of the inspection unit 110. For example, the third verification target 323 includes a first height target 323a having a first height and a second height target 323b having a second height, as shown in FIG. 3.

In an embodiment, the second verification target 322, that is, the at least two fiducial markers may be disposed around the flat area 321a. Further, the third verification target 323, that is, the at least one height marker may be disposed around the flat area 321a.

In another embodiment, the flat area 321a may be defined by the second verification target 322, that is, the at least two fiducial markers. Further, the third verification target 323, that is, the height marker may be disposed around the flat area 321a.

Figure 4A:
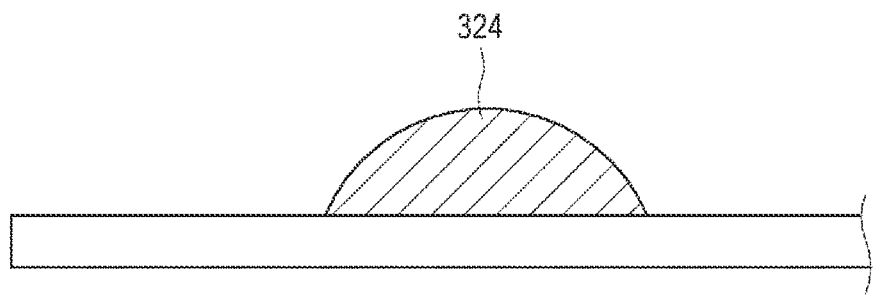
FIG. 4A is a side view showing an example of a reflector according to an embodiment of the present disclosure.
Figure 4B:
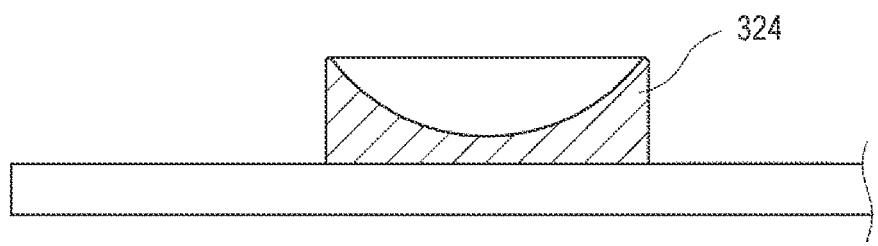
FIG. 4B is a side view showing another example of the reflector according to an embodiment of the present disclosure.

Optionally, the verification reference body 320 may further include a reflector 324. The reflector 324 is a verification target for verifying whether the light source that generates light in the inspection unit 110 has a fault. That is, the reflector 324 is a verification target for verifying whether the second lighting portion 220 that generates the color light in the inspection unit 110 has a fault. The reflector 324 may have various shapes to reflect the color light radiated from the inspection unit 110. As one example, the reflector 324 may have a convex curve shape, as shown in FIG. 4A. As another example, the reflector 324 may have a concave curve shape, as shown in FIG. 4B.

The inspection apparatus 130 further includes a cover 330. The cover 330 opens the verification reference body 320 while a fault of the inspection unit 110 is verified, and covers the verification reference body 320 to prevent dirt, dust or the like from entering the verification reference body 320 while a defect of the inspection unit 110 is not verified.

Figure 5A:
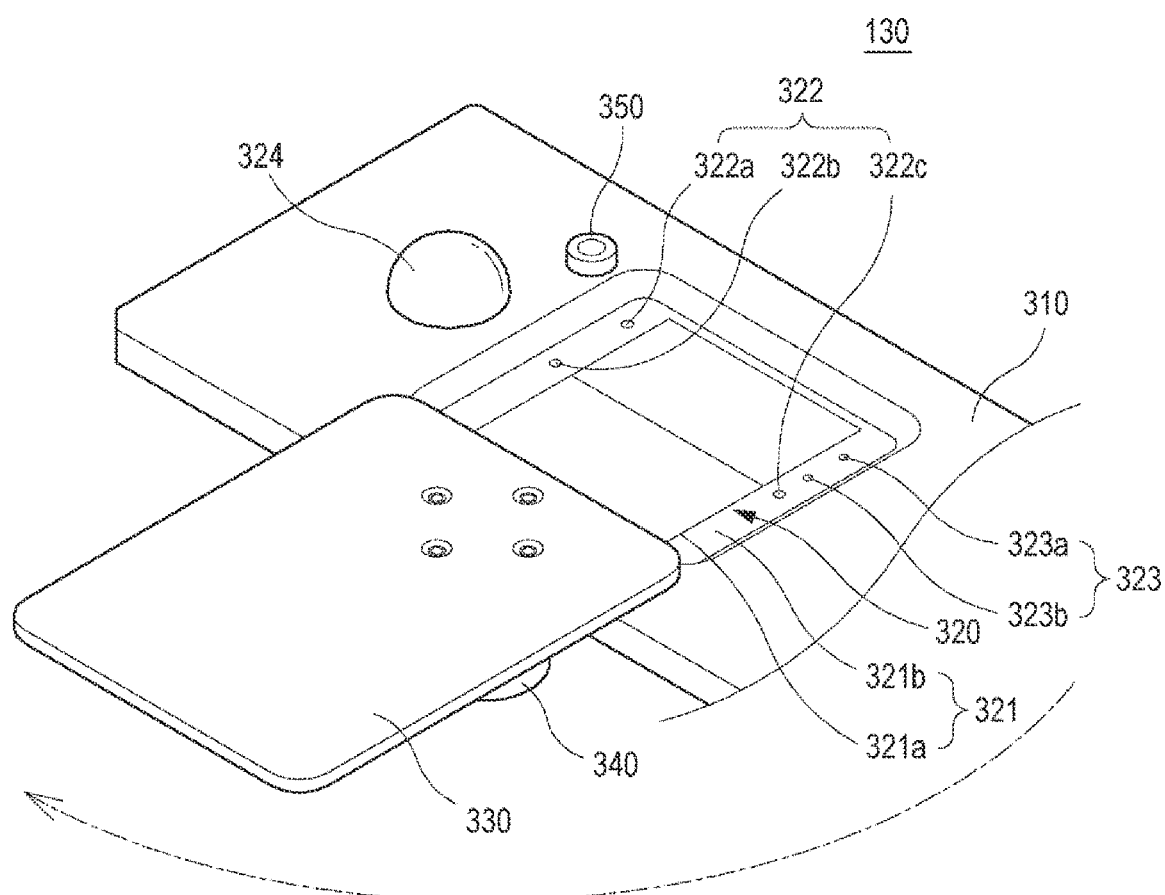
FIG. 5A is an exemplary view showing a state in which a verification reference body is open by moving a cover according to an embodiment of the present disclosure.
Figure 5B:
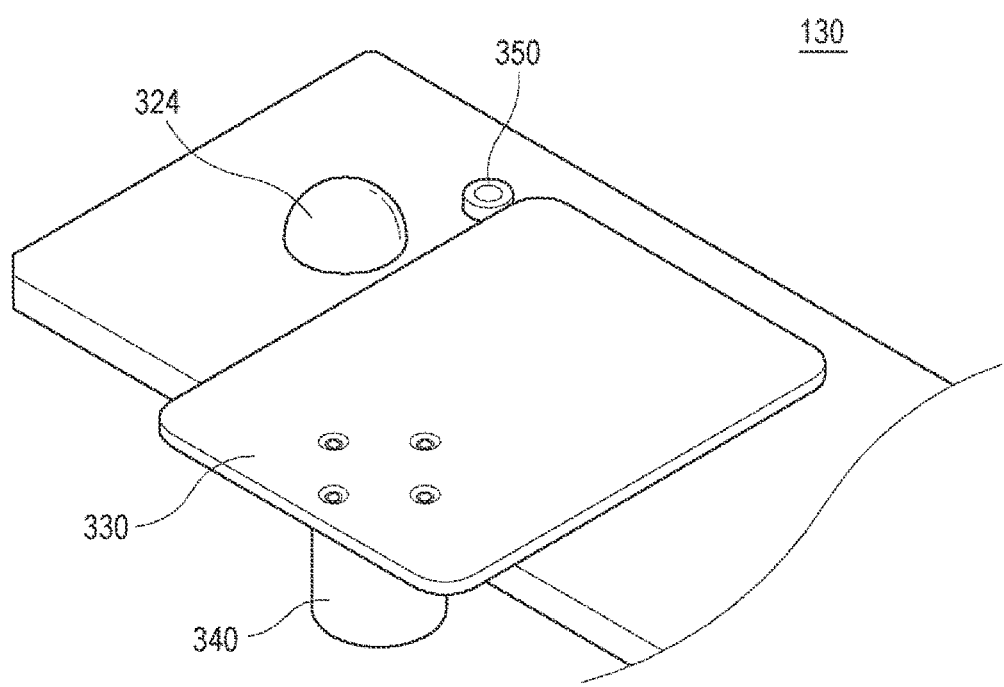
FIG. 5B is an exemplary view showing a state in which the cover according to an embodiment of the present disclosure is positioned over the verification reference body.

The inspection apparatus 130 further includes a driving unit 340. The driving unit 340 moves the cover 330 with respect to the verification reference body 320 to open and close the verification reference body 320. That is, when the verification of a fault of the inspection unit 110 is started, the driving unit 340 moves the cover, which is over the verification reference body 320, to a predetermined position to open the verification reference body 320. For example, the driving unit 340 moves the cover 330, which is over the verification reference body 320, to a predetermined position (180 degrees rotated position), as shown in FIG. 5A. Further, when the verification of a fault of the inspection unit 110 is completed, the driving unit 340 moves the cover 330, which is at the predetermined position, over the verification reference body 320 to cover the verification reference body 320, as shown in FIG. 5B. In an embodiment, the driving unit 340 includes a rotating unit that rotates the cover 330 by a predetermined angle (e.g., 180 degrees) to open and close the verification reference body 320. In another embodiment, the driving unit 340 includes a sliding unit that slides the cover 330 to open and close the verification reference body 320.

The inspection apparatus 130 further includes a stopper 350. The stopper 350 supports the cover 330 to maintain the cover 330, which is moved by the driving unit 340, over the verification reference body 320.

Referring back to FIG. 1, the inspection system 100 further includes a controller 140. In addition, the inspection system 100 may further include a storage unit (not shown), a user input unit (not shown), and an output unit (not shown). In an embodiment, the user input unit may include a keyboard, mouse or the like, and the output unit may include a display unit, a speaker or the like, however they are not limited thereto.

The controller 140 positions the inspection unit 110 over the inspection apparatus 130, obtains image data of the verification reference body 320 through the inspection unit 110, verifies whether the inspection unit 110 has a fault, and generates a verification result indicating whether the inspection unit 110 has a fault. Further, the controller 140 corrects the fault of the inspection unit 110 by calibrating the inspection unit 110 based on the generated verification result. In addition, the controller 140 controls the movement of each component of the inspection system 100, for example, the inspection unit 110, the moving unit 120, and the driving unit 340. In an embodiment, the controller 140 automatically performs the verification whether the inspection unit 110 has a fault in accordance with predetermined information. As one example, the predetermined information may include an inspection defect rate of the inspected body B. In this case, the controller 140 checks the inspection defect rate of the inspected body B, and automatically performs the verification whether the inspection unit 110 has a fault when the inspection defect rate of the inspected body B exceeds a predetermined threshold value. As another example, the predetermined information may include cycle information. The cycle information is information indicating the cycle of automatically verifying whether the inspection unit 110 has a fault. For example, the cycle information includes a cycle of every week, every second week, every month, every second month, or the like.

Although the controller 140 positions the inspection unit 110 over the inspection apparatus 130 in accordance with predetermined information in the embodiment described above, the present disclosure is not limited thereto, and the controller 140 may position the inspection unit 110 over the inspection apparatus 130 in accordance with user input information requesting the fault verification of the inspection unit 110. In this case, the controller 140 may determine whether the inspected body B is present on the moving unit 120 of the inspection system 100, and may position the inspection unit 110 over the inspection apparatus 130 in accordance with the user input information if it is determined that the inspected body B is not present on the moving unit 120.

In an embodiment, the controller 140 generates a control signal for driving the driving unit 340. For example, the controller 140 generates a first control signal for driving the driving unit 340 in accordance with predetermined information, and outputs the first control signal to the driving unit 340. Accordingly, the driving unit 340 moves the cover 330 in response to the first control signal from the controller 140, whereby the verification reference body 320 is opened. Further, when the verification whether the inspection unit 110 has a fault is completed, the controller 140 generates a second control signal for driving the driving unit 340, and outputs the second control signal to the driving unit 340. Accordingly, the driving unit 340 moves the cover 330 over the verification reference body 320 in response to the second control signal from the controller 140. Thereby the verification reference body 320 is closed to prevent dirt, dust or the like from entering the verification reference body 320.

In an embodiment, the controller 140 obtains the image data of the verification reference body 320 through the inspection unit 110 moved over the inspection apparatus 130, and verifies whether the inspection unit 110 has a fault based on the obtained image data.

As one example, the controller 140 positions the inspection unit 110 over the first verification target 321, generates a control signal for driving the inspection unit 110 and outputs the control signal to the inspection unit 110. Accordingly, the inspection unit 110 obtains the image data of the first verification target 321 by radiating light (color light or pattern light) towards the first verification target 321 and receiving light reflected from the first verification target 321, in response to the control signal from the controller 140. The controller 140 verifies whether the inspection unit 110 has a fault based on the image data of the first verification target 321 obtained through the inspection unit 110. That is, the controller 140 verifies the accuracy of the amount of light, the setting of the reference plane, and the movement amount of the pattern of the inspection unit 110 based on the image data of the first verification target 321.

As another example, the controller 140 positions the inspection unit 110 over the second verification target 322, generates a control signal for driving the inspection unit 110 and outputs the control signal to the inspection unit 110. Accordingly, the inspection unit 110 obtains image data of the second verification target 322 by radiating light (color light or pattern light) towards the second verification target 322 and receiving light reflected from the second verification target 322, in response to the control signal from the controller 140. That is, the inspection unit 110 obtains image data corresponding to each of the at least two fiducial markers. The controller 140 verifies whether the inspection unit 110 has a fault based on the image data of the second verification target 322 obtained through the inspection unit 110. That is, the controller 140 verifies the accuracy of movement of the inspection unit 110 based on the image data of the second verification target 322.

As yet another example, the controller 140 positions the inspection unit 110 over the third verification target 323, generates a control signal for driving the inspection unit 110 and outputs the control signal to the inspection unit 110. Accordingly, the inspection unit 110 obtains image data of the third verification target 323 by radiating light (color light or pattern light) towards the third verification target 323 and receiving light reflected by the third verification target 323, in response to the control signal from the controller 140. The controller 140 verifies whether the inspection unit 110 has a fault based on the image data of the third verification target 323 obtained through the inspection unit 110. That is, the controller 140 verifies the accuracy of the height measurement of the inspection unit 110 based on the image data of the third verification target 323.

Figure 6:
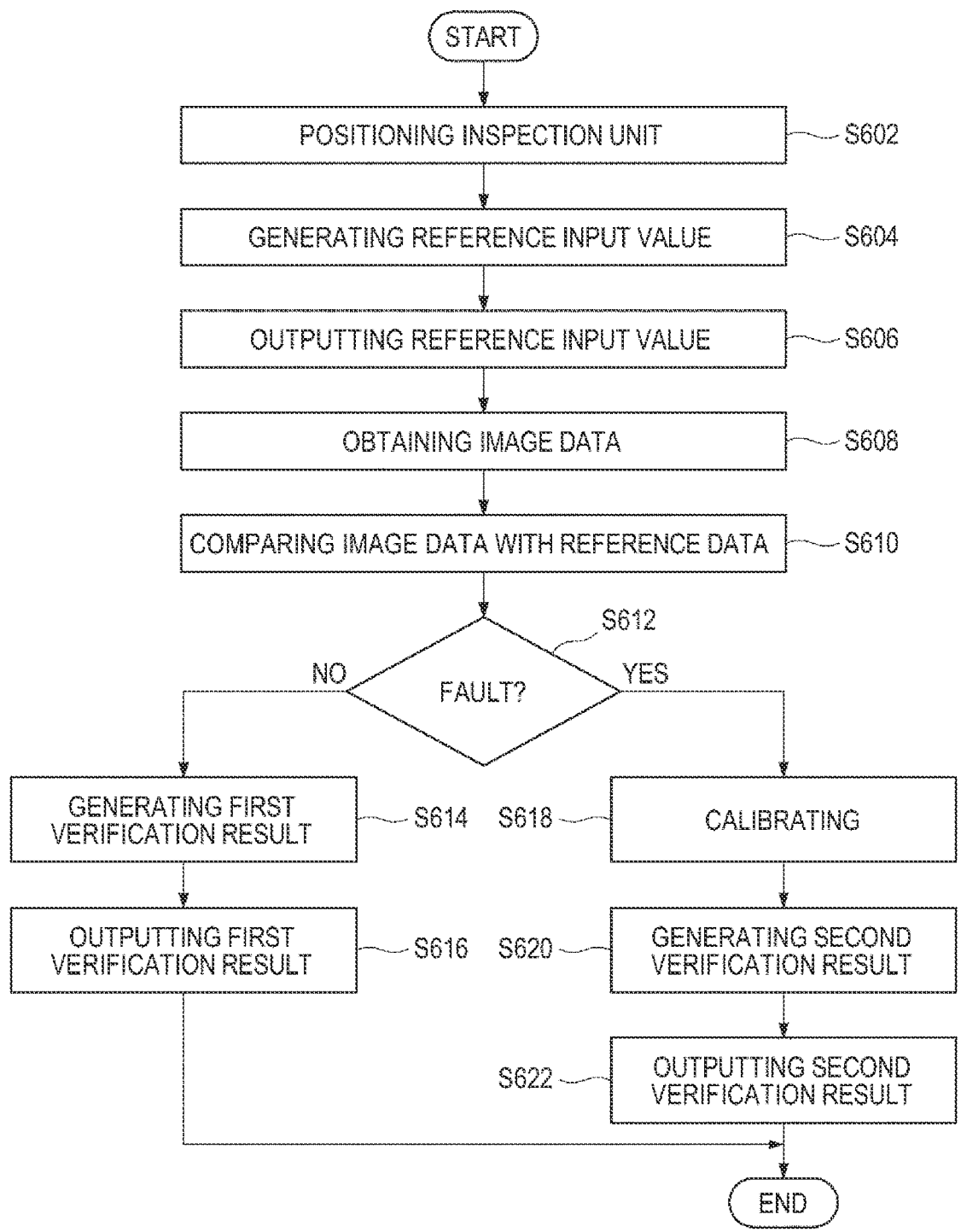
FIG. 6 is a flowchart showing a process of verifying whether the inspection unit has a fault and performing calibration of the inspection unit through a second verification target according to an embodiment of the present disclosure.

FIG. 6 is a flowchart showing a process of automatically verifying whether the inspection unit 110 has a fault and performing calibration through the second verification target 322 according to an embodiment of the present disclosure. Referring to FIG. 6, while performing an inspection process (e.g., a PCB inspection process) of the inspected body B, the controller 140 stops the inspection process of the inspected body B when a verification cycle is reached in accordance with predetermined information (e.g., predetermined verification cycle), and positions the inspection unit 110 over the second verification target 322 based on the predetermined reference position information of the second verification target 322 (S602). At this time, the verification reference body 320 is in an open state. The controller 140 generates a reference input value (S604), and outputs the generated reference input value to the inspection unit 110 (S606). The reference input value may be an input value for driving the inspection unit 110, and may be an input value for controlling the generation of the pattern light, the radiation of the pattern light, the reception of the reflected pattern light, and the acquisition of image data of the inspection unit 110. However, the reference input value is not limited thereto. Accordingly, the inspection unit 110 obtains image data of the verification reference body 320 by generating light, radiating the light towards the verification reference body 320 and receiving light reflected from the verification reference body 320 in accordance with the reference input value from the controller 140 (S608). For example, the inspection unit 110 obtains image data (hereafter, referred to as "first image data") of the verification reference body 320 including the first fiducial marker 322a by radiating the light towards the verification reference body 320 and receiving the light reflected from the verification reference body 320, in a state in which the inspection unit 110 is positioned over the first fiducial marker 322a of the second verification target 322. Next, the inspection unit 110 obtains image data (hereafter, referred to as "second image data") of the verification reference body 320 including the second fiducial marker 322b by radiating the pattern light towards the verification reference body 320 and receiving the pattern light reflected from the verification reference body 320, in a state in which the inspection unit 110 is positioned over the second fiducial marker 322b of the second verification target 322, according to the control of the controller 140. Next, the inspection unit 110 obtains image data (hereafter, referred to as "third image data") of the verification reference body 320 including the third fiducial marker 322c by radiating the pattern light towards the verification reference body 320 and receiving the pattern light reflected from the verification reference body 320, in a state in which the inspection unit 110 is positioned over the third fiducial marker 322c of the second verification target 322, according to the control of the controller 140.

The controller 140 compares the image data (i.e., the image data of the verification reference body 320) provided from the inspection unit 110 with predetermined reference data (S610), and verifies whether the inspection unit 110 has a fault (S612). For example, the controller 140 compares the first image data with the predetermined reference data, and verifies whether there is an error between the position of the first fiducial marker 322a in the first image data and the position of the first fiducial marker 322a in the predetermined reference data. Further, the controller 140 compares the second image data with the predetermined reference data, and verifies whether there is an error between the position of the second fiducial marker 322b in the second image data and the position of the second fiducial marker 322b in the predetermined reference data. In addition, the controller 140 compares the third image data with the predetermined reference data, and verifies whether there is an error between the position of the third fiducial marker 322c in the third image data and the position of the third fiducial marker 322c in the predetermined reference data.

If it is determined that the inspection unit 110 has no fault (i.e., the inspection unit 110 is normal) in step S612, the controller 140 generates a first verification result indicating that the inspection unit 110 is normal (S614), and outputs the first verification result through the output unit of the inspection system 100 (S616). In an embodiment, the first verification result may include a verification result value of the inspection unit 110. Further, the first verification result may be output in various forms (e.g., text, sound or the like).

Meanwhile, if it is determined that the inspection unit 110 has a fault in step S612, the controller 140 performs the calibration of the inspection unit 110 based on the image data of the second verification target 322 and the predetermined reference data (S618). For example, the controller 140 performs the calibration of the inspection unit 110 to correct the error between the positions of the first to third fiducial markers 322a to 322c in the image data of the second verification target 322 and the positions of the first to third fiducial markers 322a to 322c in the predetermined reference data.

Further, the controller 140 may generate second verification result indicating that the inspection unit 110 has a fault (S620), and may output the second verification result through the output unit (S622). In an embodiment, the second verification result may include a verification result value of the inspection unit 110. Further, the second verification result may be output in various forms (e.g., text, sound or the like).

The controller 140 may automatically verify whether the inspection unit 110 has a fault (fault in regard to height measurement, amount of the pattern light, degree of movement of the pattern light, and reference plane) by performing the process similar to the process shown in FIG. 6 on the first verification target 321 and the third verification target 323, and may perform the calibration of the inspection unit 110, depending on whether the inspection unit 110 has a fault.

Meanwhile, if it is verified that the inspection unit 110 has a fault in step S612 in accordance with the set method, the process goes to steps S620 and S622, and the second verification result may be output through the output unit.

FIG. 7 is a flowchart showing a process of verifying whether the inspection unit 110 has a fault through the reflector 324 according to an embodiment of the present disclosure. Referring to FIG. 7, the controller 140 positions the inspection unit 110 over the reflector 324 based on predetermined reference position information of the reflector 324 (S702). In an embodiment, the controller 140 may position the inspection unit 110 over the reflector 324 after stopping the inspection process which is running in accordance with predetermined information (e.g., the predetermined verification cycle), or before or after verifying whether the inspection unit 110 has a fault using any one of the first to third verification targets 321 to 323.

The controller 140 generates a reference input value for driving the inspection unit 110 (S704), and outputs the generated reference input value to the inspection unit 110 (S706). The reference input value may be an input value for driving the inspection unit 110, and may be an input value for controlling the generation of the color light, the radiation of the color light, the reception of the reflected color light, and the acquisition of the image data of the inspection unit 110. However, the reference input value is not limited thereto. Accordingly, the inspection unit 110 obtains image data of the reflector 324 by radiating the color light towards the reflector 324 and receiving the color light reflected from the reflector 324, in accordance with the reference input value from the controller 140. For example, when the inspection unit 110 is equipped with light emitting elements 221b and 22b of white, red, green, blue or the like, the controller 140 may position the inspection unit 110 at a position where each color light can be radiated towards the reflector 324 through the control of the X, Y and Z axes, and then may obtain the image data radiated towards the reflector 324 by controlling the emission of each color light.

Figure 8A:
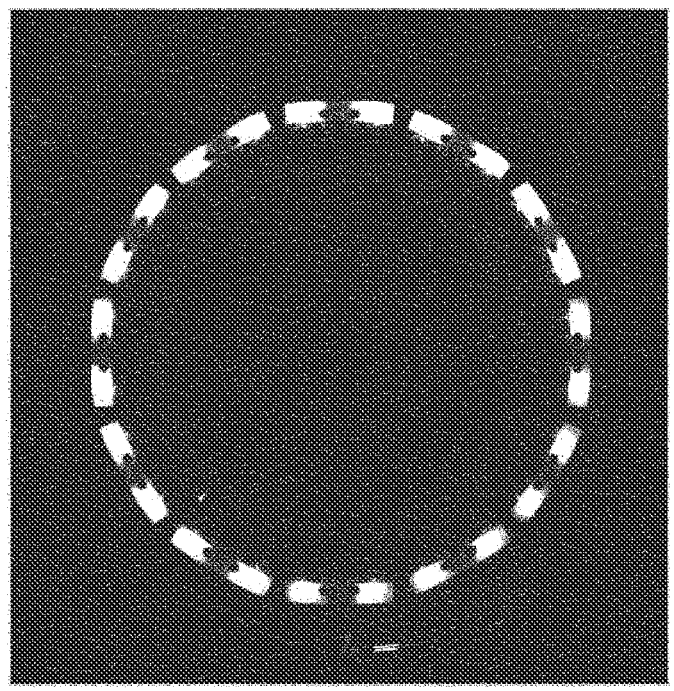
FIG. 8A is an exemplary view showing normality of a lighting portion according to an embodiment of the present disclosure.
Figure 8B:
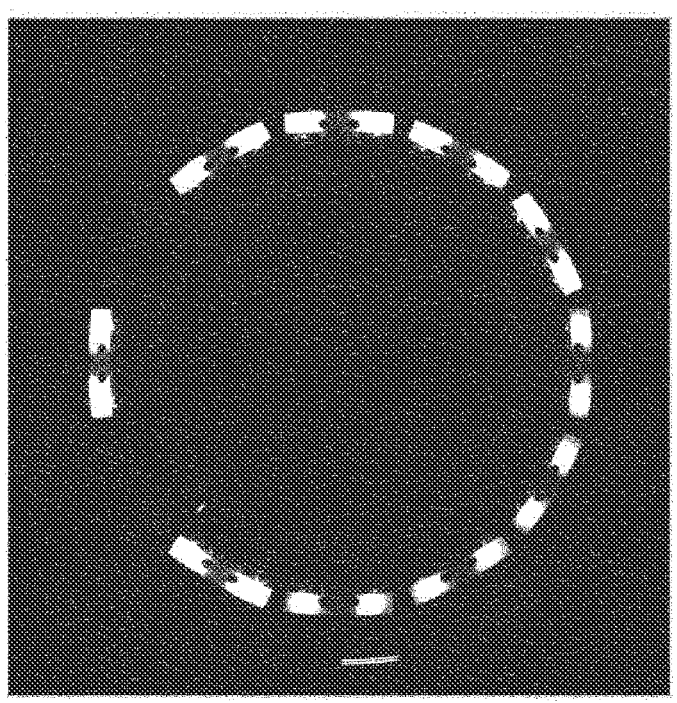
FIG. 8B is an exemplary view showing abnormality of a lighting portion according to an embodiment of the present disclosure.

The controller 140 compares the image data (i.e., the image data of the reflector 324) provided by the inspection unit 110 with predetermined reference data (S710), and verifies whether the inspection unit 110 has a fault (S712). For example, the controller 140 compares the image data of the reflector 324 with the predetermined reference data of the reflector 324, and determines whether the light emitting elements 221b and 222b of the second lighting portion 220 of the inspection unit 110 are all normal as shown in FIG. 8A, or whether some of the light emitting elements 221b and 222b of the second lighting portion 220 of the inspection unit 110 are abnormal as shown in FIG. 8B.

If it is verified in step S712 that the inspection unit 110 has no fault (i.e., it is verified that the light sources (i.e., the first light emitting element 221b or the second light emitting element 222b) of the second lighting portion 220 are normal), the controller 140 generates a first verification result indicating that the inspection unit 110 is normal (S714), and outputs the generated first verification result through the output unit (S716). The first verification result may be output in various forms (e.g., text, sound or the like).

Meanwhile, if it is verified in step S712 that the inspection unit 110 has a fault (i.e., it is verified that at least one of the light sources (i.e., the first light emitting element 221b or the second light emitting element 222b) of the second lighting portion 220 is abnormal), the controller 140 generates a second verification result indicating that the inspection unit 110 is abnormal (S718), and outputs the generated second verification result through the output unit (S720). The second verification result may be output in various forms (e.g., text, sound or the like).

FIG. 9 is a flowchart showing a process of providing a verification result in accordance with an embodiment of the present disclosure. Referring to FIG. 9, the controller 140 automatically verifies whether the inspection unit 110 has a fault in accordance with predetermined information (e.g., the predetermined verification cycle) (S902), and generates the verification result (the first verification result or the second verification result) (S904). As one example, the first verification result may include a verification result indicating "good" or "warning" of the inspection unit 110, and the second verification result may include a verification result indicating "bad" of the inspection unit 110. As another example, the first verification result may include a verification result indicating "good" of the inspection unit 110, and the second verification result may include a verification result indicating "warning" or "bad" of the inspection unit 110.

The controller 140 stores the generated verification results in the storage unit of the inspection system 100. In an embodiment, the controller 140 may sequentially store the verification results in the storage unit of the inspection system 100 together with verification date/time information indicating the verification date/time of the inspection unit 110.

The controller 140 determines whether an instruction condition for generating a list of verification results (hereafter, referred to as "list generation instruction condition") is satisfied (S908). For example, the list generation instruction condition may include input information from a user or a predetermined time cycle. In an embodiment, the controller 140 determines whether input information for requesting a list of the verification results is received from a user through the user input unit of the inspection system 100. In another embodiment, the controller 140 determines whether the predetermined time cycle is reached.

If it is determined in step S908 that the list generation instruction condition is satisfied, the controller 140 searches the storage unit of the inspection system 100 (S910), generates a list of the verification results stored in the storage unit of the inspection system 100 (S912) and displays the generated list through the output unit of the inspection system 100 (S914). For example, the controller 140 may generate and display the list 1010 of verification results as shown in FIG. 10. In FIG. 10, reference numeral 1020 indicates an input window for selecting the number of verification results to be shown as a chart in the list 1010 of verification results, reference numeral 1030 indicates a first input button for showing the verification results corresponding to the number inputted into the input window 1020 as a chart, and reference numeral 1040 indicates a second input button for showing at least one verification result selected by a user through the user input unit as a chart.

Figure 11:
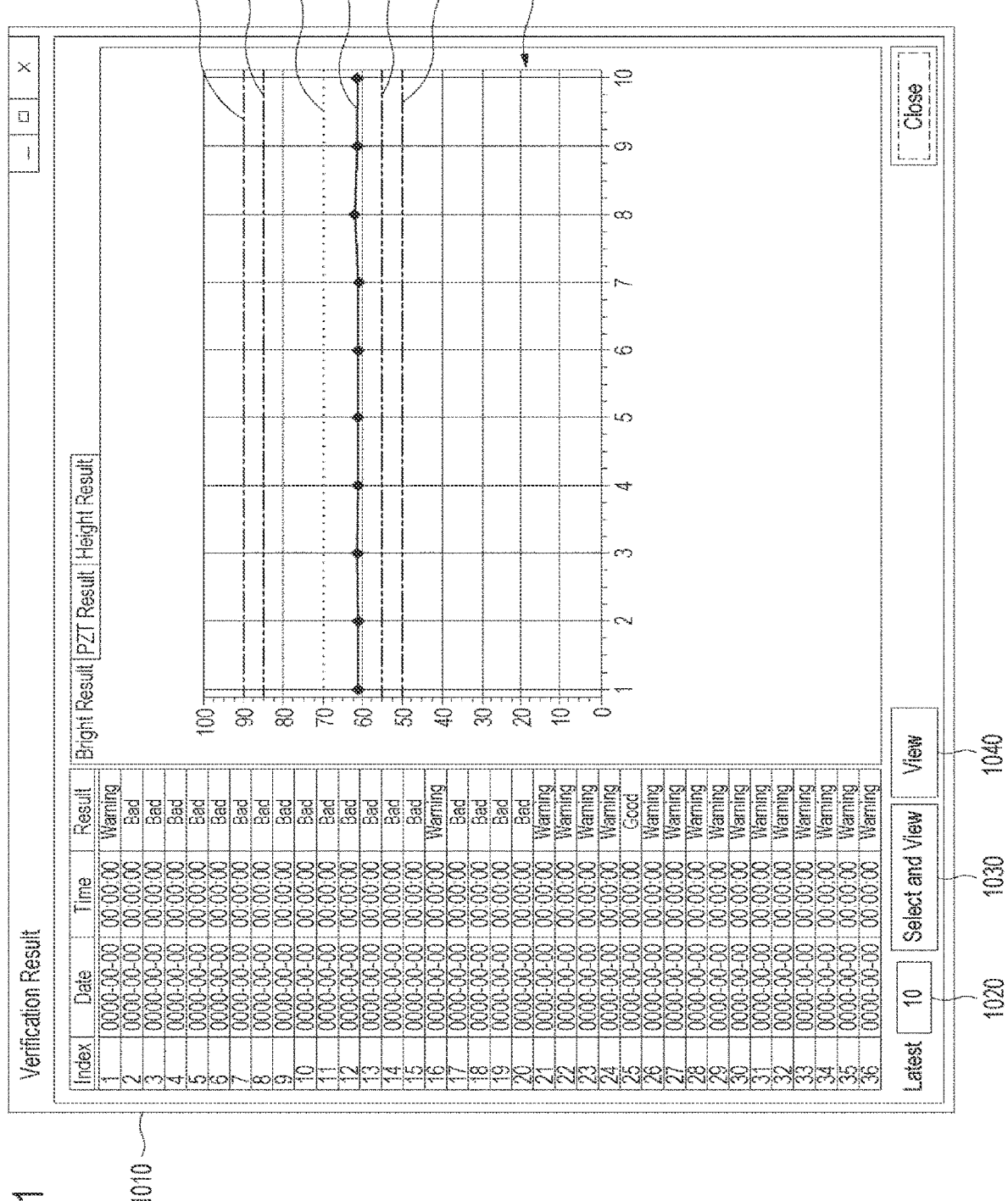
FIG. 11 is an exemplary view showing a chart of the verification results according to an embodiment of the present disclosure.

The controller 140 determines whether input information for requesting display of a chart of verification results (hereafter, referred to as "chart display request information") is received from a user through the user input unit of the inspection system 100 (S916). For example, the chart display request information includes information of selecting a verification result and information of selecting (e.g., clicking) the first input button 1030 or the second input button 1040. If it is determined in step S916 that the chart display request information is received, the controller 140 generates the chart of verification results based on the verification results corresponding to the chart display request information (S918), and displays the generated chart through the output unit of the inspection system 100. For example, the controller 140 may generate a chart 1110 of the verification results based on the verification results corresponding to the chart display request information, as shown in FIG. 11. In FIG. 11, reference numeral 1120 indicates a fault limit, that is, an error limit, reference numeral 1130 indicates a warning limit, reference numeral 1140 indicates a reference value, and reference numeral 1150 indicates the verification results. Further, in FIG. 11, the horizontal axis of the chart 1110 is an index of the list of the verification results and the vertical axis is a verification result value of the verification results.

Although the present disclosure was described with reference to preferred embodiments, it would be understood by a person skilled in the art that the present disclosure may be changed and modified in various ways without departing from the spirit and scope of the appended claims.

What is claimed is:

1. A method of verifying whether an inspection device has a fault, the method comprising:
   providing a verification reference body formed on a frame attached to an inspection system;
   positioning the inspection device over the verification reference body;
   obtaining image data of the verification reference body through the inspection device;
   verifying whether the inspection device has a fault by extracting a movement error and a height error of the inspection device from the image data; and
   generating a verification result indicating whether the inspection device has a fault,
   wherein the verification reference body comprises a flat plate and a plurality of markers for verifying the movement error and the height error of the inspection device including a height marker having a predetermined height for verifying the height error, the flat plate having an area indicating a height reference, and
   wherein the height error of the inspection device is extracted from an image data of at least one of the height reference or the height marker.

2. The method of claim 1, wherein the flat plate is indicative of a reference plane for measuring height of the inspection device, and
   wherein the plurality of markers are configured to verify an accuracy of movement of the inspection device and an accuracy of height measurement of the inspection device.

3. The method of claim 1, further comprises:
   opening the verification reference body by moving a cover while the fault of the inspection device is being verified; and closing the verification reference body by moving a cover while the fault of the inspection device is not being verified.

4. A method of verifying whether an inspection device has a fault, the method comprising:
   positioning the inspection device configured to receive light reflected from an inspected body over an inspection apparatus for verifying movement and height measurement of the inspection device in accordance with predetermined information;
   obtaining image data of the inspection apparatus through the inspection device;
   verifying whether the inspection device has a fault based on the image data;
   generating a verification result indicating whether the inspection device has a fault; and
   outputting the verification result,
   wherein the inspection apparatus comprises a height marker having a predetermined height and a height reference for verifying the fault of the inspection device, and
   wherein whether the inspection device has the fault is verified based on the image data of at least one of the height marker and the height reference.

5. The method of claim 4, wherein the predetermined information includes an inspection defect rate of the inspected body.

6. The method of claim 4, wherein the inspection apparatus comprises a verification reference body for verifying whether the inspection device has a fault, and
   wherein the verification reference body comprises a flat plate and a plurality of markers for verifying a movement error and a height error of the inspection device.

7. The method of claim 4, wherein the inspection apparatus comprises a verification reference body for verifying whether the inspection device has a fault, and
   wherein the verification reference body comprises:
      a flat plate indicating a reference plane for measuring height of the inspection device; and
      a plurality of markers for verifying an accuracy of movement of the inspection device and an accuracy of height measurement of the inspection device.

8. The method of claim 4, further comprising performing calibration of the inspection device according to the verification result.

9. The method of claim 4, wherein the outputting the verification result comprises displaying the verification result as a chart.

10. The method of claim 6, further comprises:
    opening the verification reference body by moving a cover while the fault of the inspection device is being verified; and
    closing the verification reference body by moving a cover while the fault of the inspection device is not being verified.

11. An inspection apparatus for verifying whether an inspection device has a fault, the inspection apparatus comprising:
    a frame attachable to an inspection system; and
    a verification reference body formed on the frame,
    wherein the verification reference body comprises a flat plate and a plurality of markers for verifying a movement error and a height error of the inspection device including a height marker having a predetermined height for verifying the height error, the flat plate having an area indicating a height reference, and
    wherein the height error of the inspection device is extracted from an image data of at least one of the height reference or the height marker.

12. The inspection apparatus of claim 11, wherein the verification reference body comprises the flat plate having a flat area capable of indicating a height reference and a gray level, at least two fiducial markers disposed around the flat area, and the height marker disposed around the flat area.

13. The inspection apparatus of claim 11, wherein the flat plate is indicative of a reference plane for measuring height of the inspection device, and
    wherein the plurality of markers are configured to verify an accuracy of movement of the inspection device and an accuracy of height measurement of the inspection device.

14. The inspection apparatus of claim 11, further comprises:
    a cover closes the verification reference body while the fault of the inspection device is being verified, and opens the verification body while the fault of the inspection device is not being verified; and
    a driver configured to move the cover according to whether the inspection device is being verified or not.

* * * * *